United States Patent [19]

Matsuyama et al.

[11] 4,032,892
[45] June 28, 1977

[54] SEMICONDUCTOR SPEECH CHANNEL SWITCH

[75] Inventors: Mitsuo Matsuyama, Yokohama; Shinzi Okuhara, Fujisawa, both of Japan

[73] Assignee: Hitachi, Ltd., Japan

[22] Filed: Dec. 22, 1975

[21] Appl. No.: 642,719

[30] Foreign Application Priority Data

Dec. 27, 1974 Japan .............................. 49-148619

[52] U.S. Cl. ......................... 340/166 R; 179/18 GF
[51] Int. Cl.² .......................................... H04Q 3/50
[58] Field of Search ............. 340/166 R; 179/18 GF

[56] References Cited
UNITED STATES PATENTS

| 3,204,037 | 8/1965 | Hartley | 179/18 GF |
| 3,204,044 | 8/1965 | Porter | 179/18 GF |
| 3,542,963 | 11/1970 | Aagard | 179/18 GF |
| 3,564,291 | 2/1971 | Aagard | 179/18 GF |

Primary Examiner—Harold I. Pitts

Attorney, Agent, or Firm—Craig & Antonelli

[57] ABSTRACT

A semiconductor speech path switch selectively connects a transmitting circuit which is connected with a row line to one of a plurality of receiving circuits which are respectively connected with associated column lines, the row lines and column lines forming a matrix of signal transmission lines. The switch includes a plurality of PNPN switching elements respectively connected across row and column lines of the matrix, a plurality of diodes for triggering the respective switching elements and a plurality of control gate lines connected with the diodes for triggering each switching element. Control signals are applied to input terminals of respective switching circuits to selectively energize the individual PNPN switching elements during the presence of a control signal supplied thereto. In the absence of the control signal, the control gate lines are shunted to ground to prevent cross-talk interference and erroneous triggering of non-selected PNPN switching elements.

10 Claims, 5 Drawing Figures

SEMICONDUCTOR SPEECH CHANNEL SWITCH

BACKGROUND OF THE INVENTION

1. Field of the Invention

This invention relates to a semiconductor speech channel switch using PNPN switches as switching elements, which speech channel switch is incorporated in communications equipment such as a telephone exchange system and the like.

2. Description of the Prior Art

In a conventional automatic telephone exchange system, the ringing signal (audible bell) signal), speech current, dial pulses, charging signal and other required signals are applied to necessary equipment through a speech channel switch, for example, a mechanical contact type switch represented generally by a crossbar switch. With the development of an electronic exchange system, however, all the peripheral control circuits provided for the control of the speech channel switch have already been replaced by electronic circuits, and it has been strongly demanded to realize a speech channel switch consisting of electronic elements too for the purposes of further reducing the overall volume of the exchange system, improving the operating performance of the exchange system, reducing the equipment cost, etc.

An attempt was made in the past for realizing a speech channel switch by using gas discharge tubes as the switching elements thereof. With the recent progress of the semiconductor industry, especially progress in integrated circuit techniques, it has become possible to realize a semiconductor speech channel switch. Especially, a PNPN switch is considered to be most suitable for use as the switching element of such a semiconductor speech channel switch.

The PNPN switch has a four layer structure; P, N, P and N layers, with three PN junctions and therefore it has junction capacitances between adjacent layers. Accordingly, if such a PNPN switch is used in a speech channel switch such as a telephone exchange system and the like, there is a drawback of crosstalk due to said junction capacitances. The crosstalk increases as the frequency of the signal treated by the speech channel switch increases. In order to use the PNPN switches as speech channel switches for wide-band communications, therefore, some device to eliminate such crosstalk must be taken into consideration. However, since such a device has been provided by the inventors for other demands, the description thereof is omitted here.

Now, where PNPN switching elements, of the type described above, are arranged in an mXn matrix array to form a speech path switching arrangement, let us consider the manner of selectivey driving the arrangement.

As one technique, a driving circuit may be provided for each of the PNPN switches. However, this technique requires that the number of driving circuits correspond to the number of the switching elements of the array so that it is quite complex and costly.

In contrast to this technique, the individual switching elements may be selectivey driven by selecting either an incoming line or an outgoing line for signal transmission, and selecting an individual driving circuit for energizing the PNPN switches of the m-th group of switches corresponding to either a column line or a row line of the mXn matrix array. This technique requires m driving circuits for the mXn matrix array and, accordingly, is economically more advantageous over the above described technique, since the number of driving circuits is reduced. However, this improved technique, from the standpoint of circuit complexity and cost, has its own problem in that crosstalk between the individual PNPN switching element arises.

SUMMARY OF THE INVENTION

The object of this invention is to provide a semiconductor speech channel switch whose crosstalk characteristic is much improved.

According to this invention, there is provided a semiconductor speech channel switch comprising the 1 x n PNPN switches as switching elements, in which the PNPN switches in each switch array connected in common at the anode thereof are connected in multiple at the control gate thereof to substantially a single control gate common line through respective diodes, and a single gate-triggering circuit capable of switching the output current thereof by being controlled by an external control source is connected to this control gate common line for supplying either constant triggering current or voltage to the control gate of each of said PNPN switches and also switching means is connected between said control gate common line and the ground, which switching means remains normally closed to provide a low impedance therebetween but is opened only at the moment of said control gate being triggered, thereby performing a switching action in the phase opposite to that of the operation of said single gate-triggering circuit.

BRIEF DESCRIPTION OF THE DRAWINGS

The present invention will be apparent from the following detailed description taken in conjunction with the accompanying drawings, in which.

DETAILED DESCRIPTION OF THE PRIOR ART

Prior to the description of the embodiments of this invention, a conventional speech channel switch using PNPN switches will be described with the aid of FIG. 1.

Figure 1:
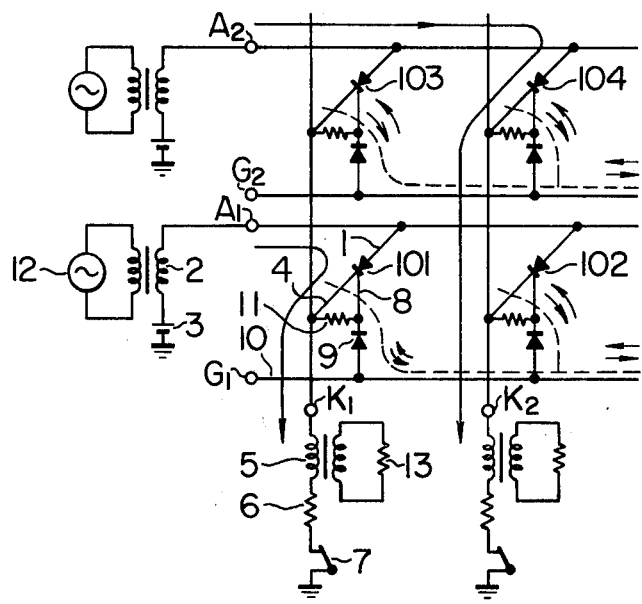
FIG. 1 shows the electric circuit of a conventional speech channel switch using PNPN switches.

FIG. 1 shows an exemplary speech channel switch in the form of a 2 × 2 matrix, using PNPN switches as switching elements. A PNPN switch 101 has its anode 1 connected through a transformer 2 with a d.c. power source 3 and its cathode 4 grounded through a transformer 5, a current-limiting resistor 6 and a current-interrupting switch 7. The cathode gate 8 of the PNPN switch 101 is connected via a diode 9 for blocking the inverse current from the cathode 4 and via a control gate common line 10, with a control gate terminal $G_1$. Between the cathode 4 and the cathode gate 8 is provided a resistor 11 for preventing erroneous firing due to the rate effect.

In this circuit, if a voltage is applied, by the power source 3, between the anode 1 and the cathode 4 of the PNPN 101 switch in its non-conductive state, the anode 1 is at a positive potential and the cathode 4 is substantially at the ground potential. Under this condition, when a pulse voltage is applied to the control gate common line 10, the gate current flows from the control gate common line 10 toward the cathode 4, and consequently the PNPN switch 101 fires thereby to cause a d.c. current to flow therethrough. Once the PNPN switch 101 fires, the d.c. current continues to flow therethrough even after the pulse voltage has vanished, since the PNPN switch has a self-holding action, and when the switch 7 is opened, the d.c. current is interrupted. Therefore, the a.c. signal delivered from a signal source 12 corresponding to a calling telephone unit is sent through the transformer 2, superposed upon the d.c. current and then applied to a load 13 corresponding to a called telephone unit.

Now, the case is considered where the PNPN switch 101 and another PNPN switch 104 are ignited and two speech channels are established as indicated by long, solid and curved arrows. In this case, as indicated by the dashed lines in FIG. 1, the signal leaks through the control gate common line 10 and the diode 9 into another speech channel so that the cross-talk characteristic is adversely affected. This phenomenon is the so-called crosstalk-via-gate.

This crosstalk-via-gate passes through a diode connected with the cathode-gate of the PNPN switch. Since the diode does not pass direct current therethrough except when the switch is triggered, the impedance of the diode is determined by the junction capacitance thereof. For this reason, as the frequency of the signal applied to the speech path switch increases, the impedance of the diode decreases, thereby increasing the problem of crosstalk-via-gate. As described above, there was difficulty in applying the triggering method, in which the gates of the PNPN switches used as speech channel switching elements are connected in common, to a wide-band speech channel switch due to the crosstalk-via-gate.

PREFERRED EMBODIMENTS OF THE INVENTION

This invention aims at providing a semiconductor speech channel switch which is free from the adverse affect due to the crosstalk-via-gate and also can use the triggering method in which the control gates of the PNPN switching elements are connected in common.

Figure 2:
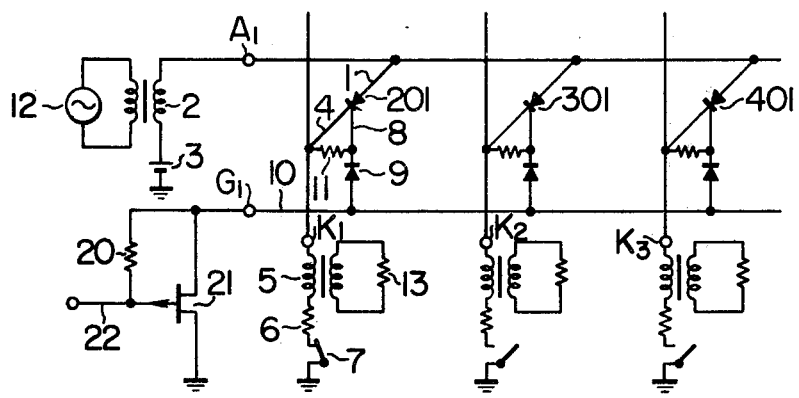
FIG. 2 shows the electric circuit of a semiconductor speech channel switch as a first embodiment of this invention.

FIG. 2 shows a first embodiment of this invention and for simplicity only a portion of a matrix consisting of PNPN switches, i.e., 1 × 3 PNPN switches 201, 301 and 401 with their anodes connected in common, is shown in the figure. The cathode gates of the PNPN switches are connected in common through respective diodes and connected via a single control gate common line 10 with a control gate terminal $G_1$.

A resistor 20 and the drain of a P-channel junction type field effect transistor 21 (hereinafter referred to as FET) are connected to the control gate terminal $G_1$. Also, the gate of FET 21 and resistor 20 are connected to control terminal 22 and the source of the FET 21 is grounded.

First, the case where the PNPN switch 201 is ignited, will be described.

When a voltage pulse is applied to a control signal terminal 22 with the switch 7 closed, the FET 21 is cut off due to pinch-off so that the gate current flows through the resistor 20 into the control gate common line 10. The current further flows toward the cathode 4 of the PNPN switch 201 through the diode 9 for use in blocking inverse current and the resistor 11 for use in preventing the rate effect. When the voltage drop across the resistor 11 exceeds the built-in voltage of the PN-junction of the diode 9, a current flows into the cathode gate 8 of the PNPN switch 201 so that the PNPN switch 201 is ignited.

When the application of voltage pulses to the control terminal 22 ceases, FET 21 shifts from the pinched-off state to the conducting state, so that the impedance between the drain and the source of FET 21 is very low and the potential of the control gate terminal $G_1$ is maintained at substantially ground potential. Since PNPN switch 201 is at substantially the same positive potential as that of DC power source 3. Accordingly, diode 9 is reverse-biased, so that current does not flow from the PNPN switch element due to the interposition of the diode 9, even when the impedance between the control gate terminal $G_1$ and ground becomes low due to FET 21. The impedance of the diode 9 is considerably greater, however, due to the typical capacitance value of the PN junction capacitance of the diode and the resulting impedance for a high frequency signal. Since the impedance of FET 21 is sufficiently small, crosstalk from other speech path switching elements which would otherwise interfere with the selected PNPN switching element is effectively shunted to ground through FET 21.

Thus, the crosstalk characteristic is not deteriorated. Namely, the use of this invention prevents the adverse affect at the actuation of gates and therefore the crosstalk-via-gate.

Figure 3:
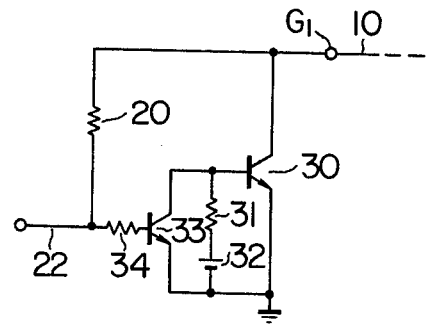
FIG. 3 shows the electric circuit of a principal portion of a semiconductor speech channel switch as a second embodiment of this invention.

FIG. 3 shows a semiconductor speech channel switch as a second embodiment of this invention, with the portion of the circuit comprising PNPN switches omitted. In this embodiment, the switching means, which is the gist of this invention, consists of a transistor 30 connected with the control gate common line 10, a current-limiting resistor 31, a d.c. power source 32, a transistor 33 for switching control, a current-limiting resistor 34 and a triggering resistor 20.

Under the condition where no input signal is applied to the external control terminal 22, the transistor 33 is cut off and a base current is supplied by the power source 32 for the transistor 30. Accordingly, the transistor 30 is rendered conductive so that the crosstalk signal via the gate of the PNPN switch does not leak into other PNPN switches but flows to ground.

On the other hand, when a voltage pulse for triggering the gates is applied to the external control terminal 22, the transistor 33 is rendered conductive and the current from the source 32 flows through the transistor 33 as the collector current thereof, so that the transistor 30 is cut off never to affect a triggering action of the PNPN switches.

Figure 4:
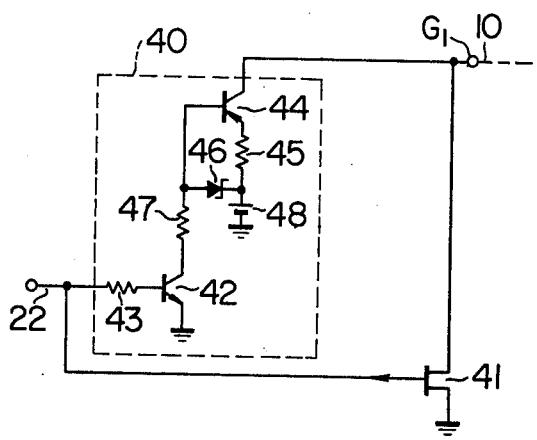
FIG. 4 shows the electric circuit of a principal portion of a semiconductor speech channel switch as a third embodiment of this invention.

FIG. 4 shows a semiconductor speech channel switch as a third embodiment of this invention and also in this figure the portion of the circuit comprising the PNPN switches is not shown.

In this embodiment, the method of triggering the PNPN switches is of constant-current type and reference numerals 40 and 41 designate a constant-current type gate-triggering circuit and a P-channel juncrion type field effect transistor (FET), respectively. The constant-current type gate-triggering circuit 40 is constituted of a control transistor 42, a resistor 43, a transistor 44 for supplying gate current, a resistor 45 for setting the value of the gate current, a constant-voltage diode 46 for voltage clamping, a current-limiting resistor 47 and a d.c. power source 48.

When there is no input signal applied to the external control terminal 22, the control transistor 42 is in its non-conductive state, so that the constant-current type gate-triggering circuit 40 is not operated while the FET 41 is kept conductive to absorb the crosstalk-via-gate.

The application of a voltage pulse to the external control signal input terminal 22 renders the control transistor 42 conductive, so that current flows from the power source 48 into the base of the transistor 44 to render the transistor 44 conductive. The voltage developed across the resistor 45 is clamped to a constant level by the constant-voltage diode 46, thereby to permit the transistor 44 keep its emitter current constant. Accordingly, a constant collector current equal to a (current amplification factor in ground-base configuration) times the emitter current flows as a gate triggering current into the control gate common line. The FET 41 is then in its cut-off state since it is pinched off while a voltage pulse is being applied to the external control terminal 22. Hence, no influence is exerted on the triggering action of the PNPN switches.

Figure 5:
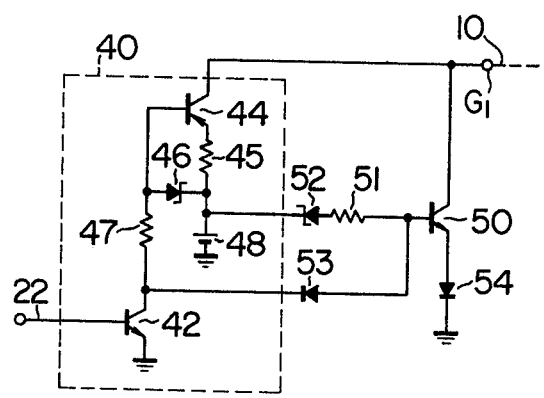
FIG. 5 shows the electric circuit of a principal portion of a semiconductor speech channel switch as a fourth embodiment of this invention.

FIG. 5 shows a semiconductor speech channel switch as a fourth embodiment of this invention. The circuit comprising the PNPN switches is also omitted for simplicity's sake in this figure. This circuit in FIG. 5 is a modification of the circuit shown in FIG. 4. Namely, the former is obtained by replacing the FET 41 of the latter with a transistor 50 and by adding a current-limiting resistor 51, a constant-voltage diode 52 and two diodes 53 and 54 thereto. The operation of the constant-current type gate-triggering circuit 40 is similar to that of the constant-current type gate-triggering circuit 40 shown in FIG. 4 and therefore apparent from the description given above for the circuit 40 in FIG. 4. Namely, the circuit 40 supplies gate-triggering current for the control gate terminal $G_1$ only when a voltage pulse is applied to the external control terminal 22, but otherwise it does not operate.

If there is no input signal applied to the external control terminal 22, the control transistor 42 is in its cut-off state, so that a current flows from the d.c. source 48 into the base of the transistor 50 through the constant-voltage diode 52 and the resistor 51 to render the transistor 50 conductive. On the other hand, when a voltage pulse is applied to the external control signal input terminal 22, the control transistor 42 is rendered conductive. Then, the base current of the transistor 50 is absorbed by the control transistor 42 through the diode 53, so that the transistor 50 is turned off. Accordingly, the transistor 50 absorbs the crosstalk-via-gate signal and no influence is exerted on the triggering action of the PNPN switches.

As described above, in a semiconductor speech channel switch according to this invention, the PNPN switches are connected in common at the control gate thereof through the respective diodes to the control gate common line which is grounded via a switching circuit or element which is opened only at the moment when the control gate is triggered and which remains closed to provide a low impedance when the control gate is not triggered.

The switching means such as the switching circuit or element described above is by no means limited to those used in the described embodiments.

Thus, according to this invention, there is obtained a semiconductor speech channel switch to which the triggering method, in which the control gates of the PNPN switches are connected in common, can be applied without any adverse affect upon the function of the PNPN switches and without any deterioration of the crosstalk characteristic due to the crosstalk-via-gate.

What we claim is:

1. In a semiconductor speech path switch arrangement for selectively connecting a transmitting circuit, which is connected to a prescribed row line of a matrix made up of $m$ rows and $n$ columns of signal transmission lines where $m$ is an integer and $n$ is an integer greater than 1, to a receiving circuit connected with one of the column lines of signal transmission lines, said arrangement including
    an $m \times n$ matrix of PNPN switching elements, each element having an anode connected to a respective row line, a cathode connected to a respective column line, and a control gate for receiving a control signal to render said element conductive to interconnect the row line and the column line to which said element is connected and thereby provide a signal transmission path from a transmitting circuit through said matrix to a receiving circuit, and
    a number $m$ of control gate lines respectively connected through diodes to the control gate of the $m$ rows of said PNPN switching elements, by way of which said control signal is applied to control gate of the PNPN switching elements;
    the improvement comprising
    switching means, connected to each respective control gate line and having respective input terminals to which control signals are applied, for coupling a respective control signal to a respective control gate line to thereby render a selected switching element conductive only during the application of a control signal to a respective input terminal, and for otherwise providing a low impedance shunt path for signals appearing on a respective control gate line away from the diodes connected to the control gates of a respective row of switching elements.

2. The improvement according to claim 1, wherein said switching means includes a gate-triggering constant-voltage circuit, connected between a respective input terminal and a respective control gate line, for switching the output voltage thereof in response to said control signal.

3. The improvement according to claim 1, wherein said switching means includes a gate-triggering constant-current circuit, connected between a respective input terminal and a respective control gate line, for switching the output current thereof in response to said control signal.

4. The improvement according to claim 1, wherein said low impedance shunt path is provided between a respective control gate line and ground.

5. The improvement according to claim 4, wherein said switching means includes a field effect transistor having a drain connected to a respective control gate line, a source connected to ground, and a gate connected to a respective input terminal.

6. The improvement according to claim 5, further comprising a coupling resistor connected between the gate and drain of said field effect transistor.

7. A semiconductor speech channel switch as claimed in claim 1, characterized in that switching means comprises two transistors, two resistors and a d.c. power source, said two transistors being composed of a first and a second transistor, in which switching means the base of said first transistor is connected to the collector of said second transistor, the emitters of said first and second transistors being grounded, a series circuit composed of said first resistor and said a d.c. power source being connected between the base and emitter of said first transistor, the collector of said first transistor being connected to a respective control gate line, and the base of said second transistor being connected to a respective input terminal through said second resistor.

8. The improvement according to claim 3, wherein said gate-triggering constant-current circuit comprises a first transistor having a base coupled to a respective input terminal, a grounded emitter, and a collector, a second transistor having a base coupled to the collector of said first transistor, a collector connected to a respective control gate line and an emitter coupled to a source of bias voltage, and a constant voltage diode connected between said source of bias voltage and the base of said second transistor.

9. The improvement according to claim 8, wherein said switching means includes a field effect transistor having a drain connected to a respective control gate line, a source connected to ground, and a gate connected to a respective input terminal.

10. The improvement according to claim 8, wherein said switching means further comprises a third transistor having a base coupled through a further constant voltage diode to said source of bias voltage, a collector connected to a respective gate control line and an emitter coupled to ground through a diode, and a further diode connecting the collector of said first transistor to the base of said third transistor.

* * * * *